(12) United States Patent
Hwang et al.

(10) Patent No.: US 6,723,964 B2
(45) Date of Patent: Apr. 20, 2004

(54) APPARATUS FOR HEATING AND COOLING SEMICONDUCTOR DEVICE IN HANDLER FOR TESTING SEMICONDUCTOR DEVICE

(75) Inventors: Hyun Joo Hwang, Kyonggi-do (KR); Byeng Gi Lee, Kyonggi-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 10/314,362

(22) Filed: Dec. 9, 2002

(65) Prior Publication Data

US 2003/0113106 A1 Jun. 19, 2003

(30) Foreign Application Priority Data

Dec. 17, 2001 (KR) .................................... 2001-0080157

(51) Int. Cl.[7] ................................................ H05B 3/68
(52) U.S. Cl. ................................ 219/444.1; 219/443.1; 219/390; 219/405; 219/448.1; 219/466.1; 219/482; 219/476; 392/416; 392/418
(58) Field of Search ................................ 219/390, 405, 219/411, 444.1, 443.1, 448.11, 451.1, 462.1, 463.1, 465.1, 467.1, 466.1, 476, 478, 480, 482–484; 392/416, 418

(56) References Cited

U.S. PATENT DOCUMENTS

| 4,113,547 A | * | 9/1978 | Katz et al. .................. 156/612 |
| 5,854,468 A | * | 12/1998 | Muka .......................... 219/443 |
| 5,892,207 A | * | 4/1999 | Kawamura et al. ......... 219/492 |
| 6,575,737 B1 | * | 6/2003 | Perlov et al. ................. 432/81 |

FOREIGN PATENT DOCUMENTS

WO  WO 01/82334 A2  11/2001

* cited by examiner

Primary Examiner—Shawntina Fuqua
(74) Attorney, Agent, or Firm—Fleshner & Kim, LLP

(57) ABSTRACT

A heating and cooling apparatus is provided which employs a series of thermally conductive plates thermally coupled to heating and cooling devices to heat or cool a mounting plate loaded with semiconductor devices. The mounting plate is assembled on a heating plate, which is then assembled on a cooling plate. The heating plate includes upper and lower plates with a heater therebetween which can heat the heating plate to a desired temperature, which in turn heats the mounting plate and the semiconductor devices. The cooling plate has 'S' shaped flow grooves formed throughout. When cooling fluid is flowed through the flow grooves, the cooling plate is cooled, which cools the heating plate, which in turn cools the mounting plate and the semiconductor devices.

25 Claims, 3 Drawing Sheets

APPARATUS FOR HEATING AND COOLING SEMICONDUCTOR DEVICE IN HANDLER FOR TESTING SEMICONDUCTOR DEVICE

This application claims the benefit of the Korean Application No. P2001-80157 filed on Dec. 17, 2001, which is hereby incorporated by reference.

BACKGROUND OF THE INVENTION

1. Field of the Invention

The present invention relates to an apparatus for heating and cooling a semiconductor device in a handler for testing the semiconductor device, and more particularly, to an apparatus for heating and cooling a semiconductor device in a handler for testing the semiconductor device, in which the semiconductor device is made to a desired temperature state of high temperature or low temperature within a single apparatus to thereby allow an operator to test the semiconductor device under a desired temperature.

2. Discussion of the Related Art

Generally, the handler is an apparatus for testing semiconductor devices. While semiconductor devices loaded into trays are automatically transferred between processes using an apparatus for transferring semiconductor devices, the semiconductor devices are installed in a test socket of a test site and then a desired test is performed. After the test, the semiconductor devices are classified into several grades according to the test results, and processes of a gain unloading them into the trays are repeatedly performed.

In these days, as the environments to which semiconductor devices are applied are manifold, it is requested that the semiconductor devices should perform their inherent functions stably at an environment of a specific temperature such as high temperature or low temperature as well as room temperature. To this end, it is requested that the horizontal handlers should create a user-desired specific environment to test the performance of the semiconductor devices at a predetermined temperature within itself.

In the conventional handler, multiple chambers are installed adjacent to each other, and heater, blower and liquefied nitrogen injection system are installed in these chambers. After creating an environment of high temperature or low temperature, the handler transfers test trays in which semiconductor devices are loaded from one chamber to another chamber to test the semiconductor devices under a desired temperature condition using various methods.

Then, the conventional temperature test method for semiconductor devices, in which the chambers enabling to create a specific test environment are installed in the handler, has an advantage in that mass of semiconductor devices can be tested, but it also has a disadvantage in that the construction of the chambers is complicated and the costs for the test are very high.

SUMMARY OF THE INVENTION

Accordingly, the present invention is directed to an apparatus for heating and cooling a semiconductor device in a handler for testing the semiconductor device that substantially obviates one or more problems due to limitations and disadvantages of the related art.

An object of the present invention is to provide an apparatus for heating and cooling a semiconductor device in a handler for testing the semiconductor device, in which the semiconductor device is precisely made to a desired temperature state of high temperature or low temperature by a simple structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an apparatus for heating and cooling a semiconductor device in a handler for testing the semiconductor device. The apparatus includes: a thermal conductive mounting plate having a plurality of seating recesses on which the semiconductor devices are mounted; a thermal conductive heating plate installed adjacent to a lower side of the mounting plate and having at least one heater installed therein, for transferring heat to the mounting plate; a thermal conductive cooling plate installed adjacent to a lower side of the heating plate on a main body of the handler and having a flow groove such that a cooling fluid fed from an external cooling fluid supply source flows and then is exhausted to an outside; a heating control means for controlling heat irradiated from the heater of the heating plate to control heating temperature of the mounting plate; and a cooling control means for controlling amount of the cooling fluid fed to the cooling plate to control cooling temperature of the mounting plate.

In an aspect of the invention, the heating control means comprises a heater controller for controlling calorific value of the heater of the heating plate, and a temperature sensor sensing temperature of the mounting place to transfer the sensed temperature to the heater controller.

Also, in an aspect of the invention, the cooling control means comprises: a solenoid valve connected to an inlet of the flow groove of the cooling plate, for controlling the supply of the cooling fluid from the cooling fluid supply source; a valve controller for controlling operation of the solenoid valve; and a temperature sensor for sensing temperature of the cooling plate to transfer the sensed temperature to the temperature sensor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
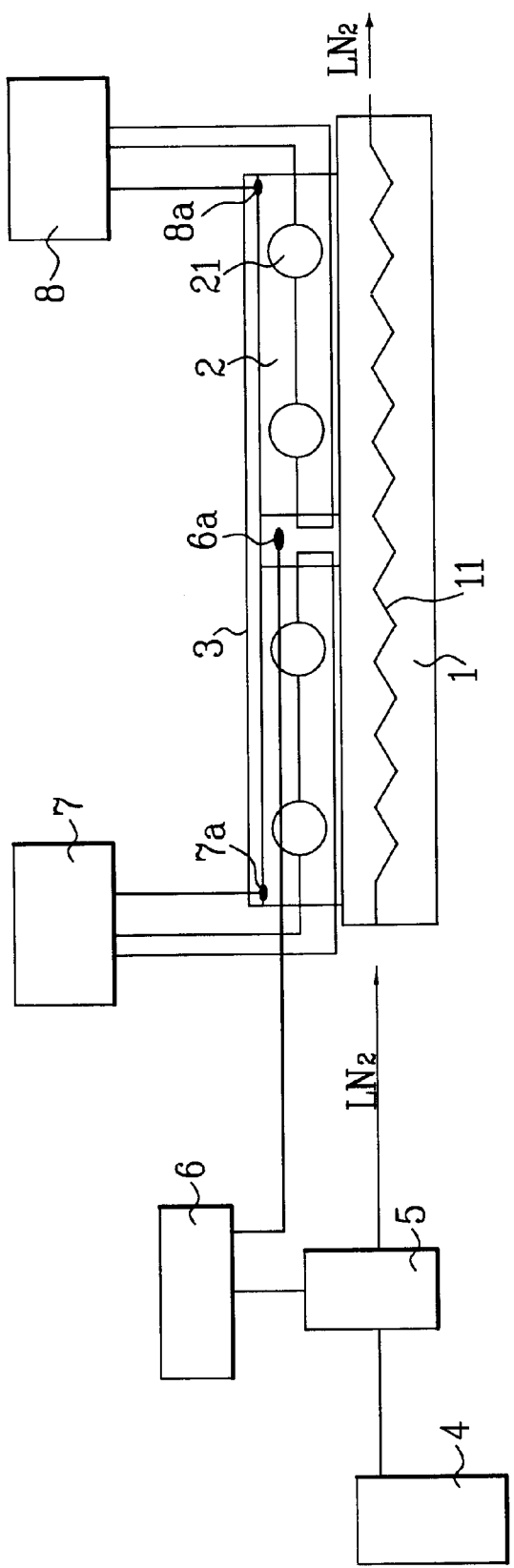
FIG. 1 is a diagram schematically showing a structure semiconductor device heating and cooling apparatus according to the present invention.
Figure 2:
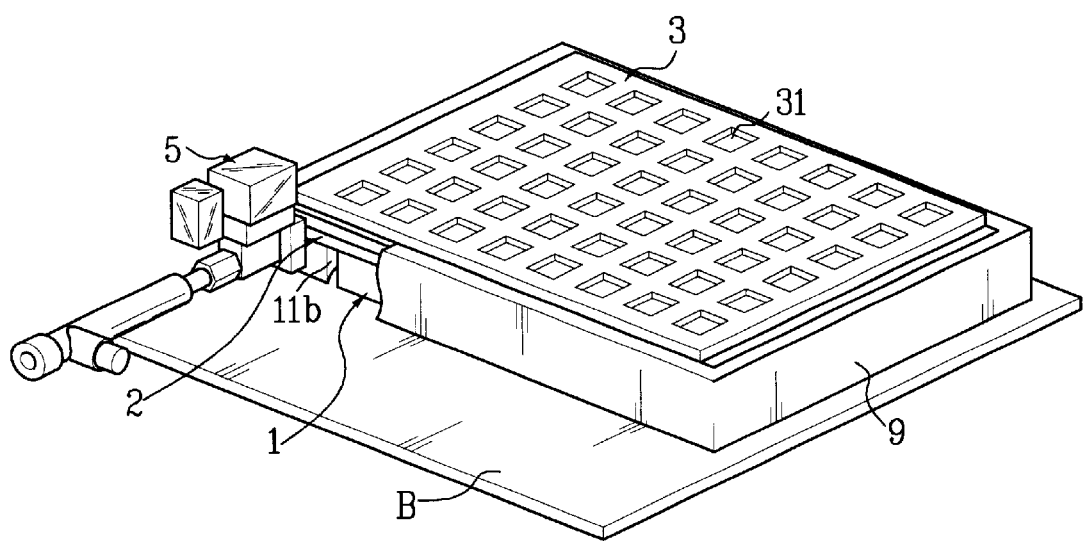
FIG. 2 is a perspective view of the heating and cooling apparatus of FIG. 1.
Figure 3:
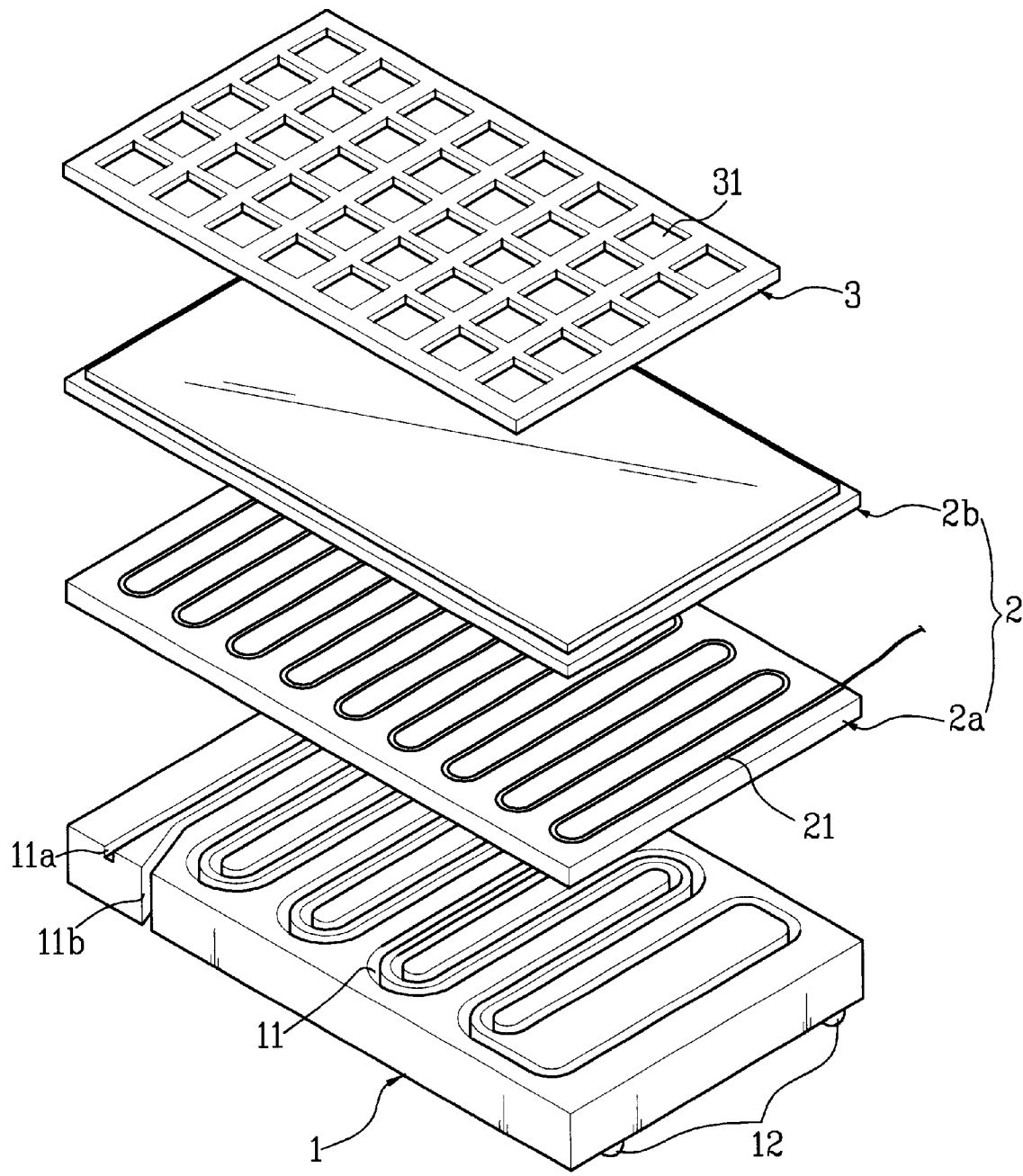
FIG. 3 is an exploded perspective view of the heating and cooling apparatus of FIG. 2.

As shown in FIGS. 1 to 3, a semiconductor device heating and cooling apparatus according to the present invention, includes: a thermal conductive cooling plate 1 installed on a base (B) of the main body of a handler; a thermal conductive heating plate 2 installed adjacent on the cooling plate 1 and having an electric heater 21 installed therein; and a thermal conductive mounting plate 3 installed adjacent on the heating plate 2 having a plurality of seating recesses 31 on which semiconductor devices are mounted. On external sidewalls of the cooling plate 1 and the heating plate 2, there is installed an adiabatic wall 9 for preventing heat exchange with external air.

A flow groove 11 through which liquefied nitrogen fed from outside flows, is formed in the cooling plate 1. This flow groove 11 is made such that it proceeds from an inlet 11a of one side end of the cooling plate 1 to an opposite side in the form a continuous S and again comes from the opposite side end to an outlet 11b adjacent to the inlet 11a in the form a continuous S.

Also, the flow groove 11 is made deeper as it travels from the inlet 11a to the outlet 11b. Heat exchange is carried out while liquefied nitrogen moves along the flow groove 11, so that the temperature of the liquefied nitrogen is gradually elevated and arrives at a maximum point at the outlet 11b. Hence, for the temperature of the liquefied nitrogen to be constantly maintained throughout the cooling plate 1, it is requested that the flow amount at the inlet having a lower temperature be small and the flow amount at the outlet having a higher temperature be large, which enables temperature balance throughout the entire region of the flow groove 11.

In order to provide a separation between the lower surface of the cooling plate 1 and the handler base (B), an insulating pedestal 12 is installed at corners of the lower surface of the cooling plate 1 such that heat is not transferred between the lower surface of the cooling plate 1 and the handler base (B).

In addition, the heating plate 2 consists of two portion, i.e., a lower plate coupled on the cooling plate 1 and an upper plate coupled on the lower plate 2a. Between the lower plate 2a and the upper plate 2b is installed an electric heater 21 which irradiates heat using an electric energy to control temperatures of the lower plate 2a and the upper plate 2b.

Preferably, the electric heater 21 is divided into two portions of left side and right side so as to easily control the temperature.

Alternatively, the electric heater 21 is formed in a continuous S figure such that it is uniformly distributed throughout the entire area of the heating plate 2.

In the meanwhile, the heating and cooling apparatus according to the present invention can maintain a semiconductor device at a desired temperature by adjusting the temperature of the mounting plate 3. For this purpose, a solenoid valve 5 is installed at the inlet 11a of the flow groove 11 of the cooling plate 1. The solenoid valve 5 is switched by a valve controller 6 to control the supply of the liquefied nitrogen (LN2) from a liquefied nitrogen supply source 4. The valve controller 6 controls the operation of the solenoid valve 5 depending on the temperature sensed by a temperature sensor 6a installed between the mounting plate 3 and the heating plate 2.

In addition, the electric heater 21 of the heating plate 2 is configured such that calorific value thereof is controlled by left and right heater controllers 7, 8. The left and right heater controllers 7 and 8 control the calorific value of the electric heater 21 based on the temperature detected by temperature sensors 7a and 8a installed between the mounting plate 3 and the heating plate 2.

Operation of the semiconductor device heating and cooling apparatus constructed as above is as follows.

First, when high temperature test of a semiconductor device is carried out, only the electric heater 21 of the heating plate 2 is driven to heat the heating plate 2 and the mounting plate 3 to a predetermined temperature in a state that the supply of the liquefied nitrogen into the cooling plate 1 is blocked.

At this time, the heater controllers 7 and 8 control the operation of the electric heater 21 depending on the temperature values detected by the temperature sensors 7a and 8a, and adjust the heating temperature of the mounting plate 3 to a set temperature.

Meanwhile, when low temperature test of a semiconductor device is carried out, liquefied nitrogen is supplied into the flow groove 11 of the cooling plate 1 to lower the temperature of the cooling plate 1 in a state that the electric heater 21 is not driven.

In other words, the valve controller 6 opens the solenoid valve 5 during the low temperature test, and thus liquefied nitrogen is supplied from the liquefied nitrogen supply source 4 into the flow groove 11 through the inlet 11a of the cooling plate 1, so that the cooling plate is cooled to a very low temperature state to take heat from the heating plate 2 and the mounting plate 3 and cool them.

At this time, the temperature sensor 6a senses the temperature of the mounting plate 3 continuously and transfers the sensed temperature to the valve controller 6. The valve controller 6 controls the solenoid valve 5 according to the sensed temperature to adjust the cooling state of the mounting plate 3.

By the aforementioned operation of the heating and cooling apparatus, the mounting plate 3 is maintained at a predetermined temperature, the picker robot (not shown) of the handler mounts a to-be-tested semiconductor device on a seating recesses 31 of the mounting plate 3, and the semiconductor device is heated or cooled during a constant time. After that, the picker robot again picks up the semiconductor device mounted on the mounting plate 3 and transfers the semiconductor device to a test site. After that, the transferred semiconductor device is subject to the temperature test.

As described previously, a semiconductor device is precisely heated or cooled to a desired temperature state within a single apparatus by a simple structure to test the semiconductor device, so that costs for manufacturing the handler are saved and its manufacturing process is simplified.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for heating and cooling one or more semiconductor devices in a handler for testing semiconductor devices, the apparatus comprising:

a mounting plate comprising a plurality of recesses configured to receive the one or more semiconductor devices;

a heating plate installed adjacent to a lower surface of the mounting plate, wherein the heating plate comprises at least one heater installed therein, and wherein the heating plate is configured to provide heat to the mounting plate;

a cooling plate installed adjacent to a lower surface of the mounting plate comprising a flow groove wherein a depth of the flow groove increases as the flow groove travels from an inlet thereof to an outlet thereof and wherein the flow groove is configured to receive cooling fluid from an external cooling fluid supply source, to distribute the cooling fluid throughout the cooling plate so as to uniformly cool the cooling plate, and to discharge the cooling fluid to an area outside of the cooling plate;

a heating control device configured to control a level of heat provided by the heater and to control a heating temperature of the mounting plate; and a cooling control device configured to control an amount of cooling fluid fed to the cooling plate and to control a cooling temperature of the mounting plate.

2. The apparatus of claim 1, wherein the heating control device comprises a heater controller configured to control a calorific value of the heater, and a temperature sensor configured to sense a temperature of the mounting plate and to transfer the sensed temperature to the heater controller.

3. The apparatus of claim 1, wherein the cooling control device comprises:

a solenoid valve connected to the flow groove and configured to control the supply of cooling fluid from the cooling fluid supply source;

a valve controller configured to control operation of the solenoid valve; and a temperature sensor configured to sense a temperature of the cooling plate and to transfer the sensed temperature to the valve controller.

4. The apparatus of claim 1, wherein the heating plate comprises an upper plate placed on and coupled to a lower plate, and wherein the heater is installed between the lower plate and the upper plate.

5. The apparatus of claim 2, wherein the heating plate comprises an upper plate placed on and coupled to a lower plate, and wherein the heater is installed between the lower plate and the upper plate.

6. The apparatus of claim 1, wherein the flow groove is configured to uniformly distribute the cooling fluid throughout an entire area of the cooling plate.

7. The apparatus of claim 1, wherein the heater is an electric heater configured to irradiate heat using an electric energy.

8. The apparatus of claim 1, further comprising an insulating pedestal installed at respective corners of the cooling plate such that a separation is provided between the cooling plate and a main body of the handler.

9. The apparatus of claim 1, further comprising an adiabatic wall enclosing external side portions of the cooling plate and the heating plate.

10. The apparatus of claim 1, wherein the mounting plate, the heating plate, and the cooling plate are all configured to be thermally conductive.

11. The apparatus of claim 1, wherein the heater comprises a first portion and a second portion, and wherein the heating control device is configured to control the first portion separate from the second portion.

12. The apparatus of claim 1, wherein the heater is formed in a continuous 'S' pattern so as to uniformly distribute a heating effect throughout the heating plate.

13. The apparatus of claim 1, wherein the volume of the flow groove is varied from an inlet portion of the flow groove to an outlet portion of the flow groove.

14. The apparatus of claim 3, wherein the solenoid valve is connected to an inlet portion of the flow groove.

15. The apparatus of claim 6, wherein the flow groove is formed in a continuous 'S' pattern so as to uniformly distribute a cooling effect throughout the cooling plate.

16. The apparatus of claim 9, wherein the adiabatic wall is configured to prevent heat exchange with the external air.

17. A semiconductor heating and cooling apparatus for use in a device test handler, comprising:

a thermally conductive mounting plate configured to receive and to hold at least one semiconductor device;

a thermally conductive heating plate installed adjacent to a lower surface of the mounting plate, comprising an upper plate coupled to an upper surface of a lower plate, and a heater installed therebetween and configured to uniformly distribute a heating effect throughout the heating plate;

a thermally conductive cooling plate installed adjacent the lower surface of the mounting plate, comprising a flow groove wherein a depth of the flow groove increases as the flow groove travels from an inlet thereof to an outlet thereof and wherein the flow groove is configured to receive cooling fluid from an external source, to uniformly distribute a cooling effect throughout the cooling plate, and to discharge the cooling fluid; and a control unit configured to control operation of the heater and a flow of cooling fluid through the cooling plate so as to control a temperature of the mounting plate.

18. The apparatus of claim 17, wherein the control unit comprises:

a heating control device configured to control a level of heat provided by the heater to the heating plate; and a cooling control device configured to control an amount of cooling fluid provided to the cooling plate.

19. The apparatus of claim 18, wherein the heating control device comprises:

a heater controller configured to control a calorific value of the heater; and a temperature sensor configured to sense a temperature of the mounting plate and to transfer the sensed temperature to the heater controller.

20. The apparatus of claim 18, wherein the cooling control device comprises:

a solenoid valve connected to the flow groove and configured to control the supply of cooling fluid from a cooling fluid supply source to the flow groove;

a valve controller configured to control operation of the solenoid valve; and a temperature sensor configured to sense a temperature of the cooling plate and to transfer the sensed temperature to the valve controller.

21. The apparatus of claim 17, wherein a volume of the flow groove is varied from an inlet portion to an outlet portion.

22. The apparatus of claim 17, further comprising an insulating pedestal installed at respective corners of the cooling plate such that a separation is provided between the cooling plate and a main body of the handler.

23. The apparatus of claim 17, further comprising an adiabatic wall enclosing external side portions of the cooling plate and the heating plate.

24. An apparatus for heating and cooling one or more semiconductor devices in a handler for testing semiconductor devices, the apparatus comprising:

a mounting plate comprising a plurality of recesses configured to receive the one or more semiconductor devices;

a heating plate installed adjacent to a lower surface of the mounting plate, wherein the heating plate comprises at least one heater installed therein, and wherein the heating plate is configured to provide heat to the mounting plate;

a cooling plate installed adjacent to a lower surface of the heating plate, comprising a flow groove wherein a depth of the flow groove increases as the flow groove travels from an inlet thereof to an outlet thereof and wherein the flow groove is configured to receive cooling fluid from an external cooling fluid supply source, and to discharge the cooling fluid to an area outside of the cooling plate;

a heating control device configured to control a level of heat provided by the heater and to control a heating temperature of the mounting plate;

a cooling control device configured to control an amount of cooling fluid fed to the cooling plate and to control a cooling temperature of the mounting plate; and an insulating pedestal installed at respective corners of the cooling plate such that a separation is provided between the cooling plate and a main body of the handler.

25. An apparatus for heating and cooling one or more semiconductor devices in a handler for testing semiconductor devices, the apparatus comprising:

a mounting plate comprising a plurality of recesses configured to receive the one or more semiconductor devices;

a heating plate installed adjacent to a lower surface of the mounting plate, wherein the heating plate comprises at least one heater installed therein, and wherein the heating plate is configured to provide heat to the mounting plate;

a cooling plate installed adjacent to a lower surface of the heating plate, comprising a flow groove wherein a depth of the flow groove increases as the flow groove travels from an inlet thereof to an outlet thereof and wherein the flow groove is configured to receive cooling fluid from an external cooling fluid supply source, and to discharge the cooling fluid to an area outside of the cooling plate;

a heating control device configured to control a level of heat provided by the heater and to control a heating temperature of the mounting plate;

a cooling control device configured to control an amount of cooling fluid fed to the cooling plate and to control a cooling temperature of the mounting plate; and an adiabatic wall enclosing external side portions of the cooling plate and the heating plate.

* * * * *